(12) United States Patent
Fuse et al.

(10) Patent No.: US 10,153,184 B2
(45) Date of Patent: Dec. 11, 2018

(54) LIGHT IRRADIATION TYPE HEAT TREATMENT APPARATUS

(71) Applicant: SCREEN Holdings Co., Ltd., Kyoto (JP)

(72) Inventors: Kazuhiko Fuse, Kyoto (JP); Yoshio Ito, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 135 days.

(21) Appl. No.: 15/150,540

(22) Filed: May 10, 2016

(65) Prior Publication Data

US 2016/0351424 A1 Dec. 1, 2016

(30) Foreign Application Priority Data

May 29, 2015 (JP) .................................. 2015-109385

(51) Int. Cl.
*H01L 21/67* (2006.01)
*F27B 17/00* (2006.01)
(Continued)

(52) U.S. Cl.
CPC .... *H01L 21/67115* (2013.01); *F27B 17/0025* (2013.01); *F27D 11/12* (2013.01); *H01L 21/6875* (2013.01)

(58) Field of Classification Search
CPC ..... H05B 3/143; H05B 3/0047; H05B 1/0233
(Continued)

(56) References Cited

U.S. PATENT DOCUMENTS

| 5,817,156 A | 10/1998 | Tateyama et al. ............ 29/25.01 |
| 6,512,207 B1 | 1/2003 | Dress et al. .................. 219/390 |

(Continued)

FOREIGN PATENT DOCUMENTS

| JP | S60-161616 A | 8/1985 |
| JP | 09-017742 | 1/1997 |

(Continued)

OTHER PUBLICATIONS

Taiwan Office Action for TW App. No. 105114019 dated Apr. 18, 2017 along with Japanese translation of the Taiwan Office Action and an English partial translation of the Taiwan Office Action based on the Japanese translation.

(Continued)

Primary Examiner — Michael Laflame, Jr.
(74) *Attorney, Agent, or Firm* — Ostrolenk Faber LLP

(57) ABSTRACT

A plurality of support pins that support a semiconductor wafer are located upright on a top surface of a susceptor. A condenser lens is located on a bottom surface of the susceptor opposite to the support pins with respect to the susceptor. The condenser lens is located such that its optical axis coincides with the central axis of the corresponding support pin. Of light emitted from halogen lamps from below, light entering the condenser lens is condensed at a contact portion between the corresponding support pin and the semiconductor wafer, so that the vicinity of the contact portion rises in temperature. The vicinity of the contact portion of the semiconductor wafer in contact with the support pin in which the temperature tends to drop is relatively intensely heated in order to suppress the temperature drop, and an in-plane temperature distribution of the semiconductor wafer during light irradiation can thus be made uniform.

3 Claims, 10 Drawing Sheets

(51) Int. Cl.
*F27D 11/12* (2006.01)
*H01L 21/687* (2006.01)

(58) Field of Classification Search
USPC .................. 392/407, 411, 415, 416, 418
See application file for complete search history.

(56) References Cited

U.S. PATENT DOCUMENTS

| | | | |
|---|---|---|---|
| 6,953,338 B2 | 10/2005 | Kreiser et al. | 432/259 |
| 8,404,048 B2 | 3/2013 | Ewert et al. | 118/725 |
| 8,454,356 B2 | 6/2013 | Camm et al. | 432/253 |
| 8,926,807 B2* | 1/2015 | Kajihara | C23C 14/50 |
| | | | 204/298.03 |
| 9,532,401 B2* | 12/2016 | Cong | H05B 1/0227 |
| 2004/0029065 A1 | 2/2004 | Kreiser et al. | 432/239 |
| 2004/0112890 A1* | 6/2004 | Kusuda | H01L 21/67115 |
| | | | 219/520 |
| 2006/0291835 A1* | 12/2006 | Nozaki | H01L 21/67115 |
| | | | 392/416 |
| 2008/0000551 A1* | 1/2008 | Sato | H01L 21/3144 |
| | | | 148/222 |
| 2008/0157452 A1 | 7/2008 | Camm et al. | |
| 2009/0175605 A1 | 7/2009 | Kobayashi | 392/416 |
| 2010/0273333 A1* | 10/2010 | Kato | F27B 17/0025 |
| | | | 438/795 |
| 2012/0231633 A1 | 9/2012 | Ewert et al. | 438/763 |
| 2012/0244725 A1 | 9/2012 | Fuse et al. | |
| 2013/0196514 A1 | 8/2013 | Ewert et al. | H01L 21/02104 |
| 2013/0270107 A1 | 10/2013 | Ewert et al. | C23C 14/34 |
| 2013/0287376 A1* | 10/2013 | Lim | H01L 21/67115 |
| | | | 392/411 |
| 2013/0315576 A1* | 11/2013 | Nishihara | H01L 21/67115 |
| | | | 392/416 |
| 2014/0161429 A1 | 6/2014 | Yokouchi et al. | H01L 21/67115 |
| 2014/0263268 A1 | 9/2014 | Cong et al. | |
| 2014/0270734 A1* | 9/2014 | Yokouchi | H05B 3/0047 |
| | | | 392/416 |
| 2016/0247692 A1 | 8/2016 | Fuse et al. | |
| 2016/0293424 A1 | 10/2016 | Fuse et al. | |

FOREIGN PATENT DOCUMENTS

| | | |
|---|---|---|
| JP | 2003-022982 A | 1/2003 |
| JP | 2003-525524 A | 8/2003 |
| JP | 2009-164451 | 7/2009 |
| JP | 2012-023116 A | 2/2012 |
| JP | 2014-160861 A | 9/2014 |
| JP | 2015-018909 | 1/2015 |
| TW | 460980 | 10/2001 |
| TW | 488009 | 5/2002 |
| TW | 200933778 | 8/2009 |
| TW | 201243954 A | 11/2012 |
| TW | 201246330 | 11/2012 |
| TW | 201433643 | 9/2014 |

OTHER PUBLICATIONS

Office Action dated May 4, 2018 in counterpart Chinese Patent Application No. 201610348854.8 with Japanese translation and English translation based on the Japanese translation. Portions relevant to prior-art based rejections are translated.

Office Action (Notification of Reason(s) for Refusal) dated Oct. 2, 2018 in counterpart Japanese Patent Application No. 2015-109385 with partial English translation.

* cited by examiner

F I G . 2
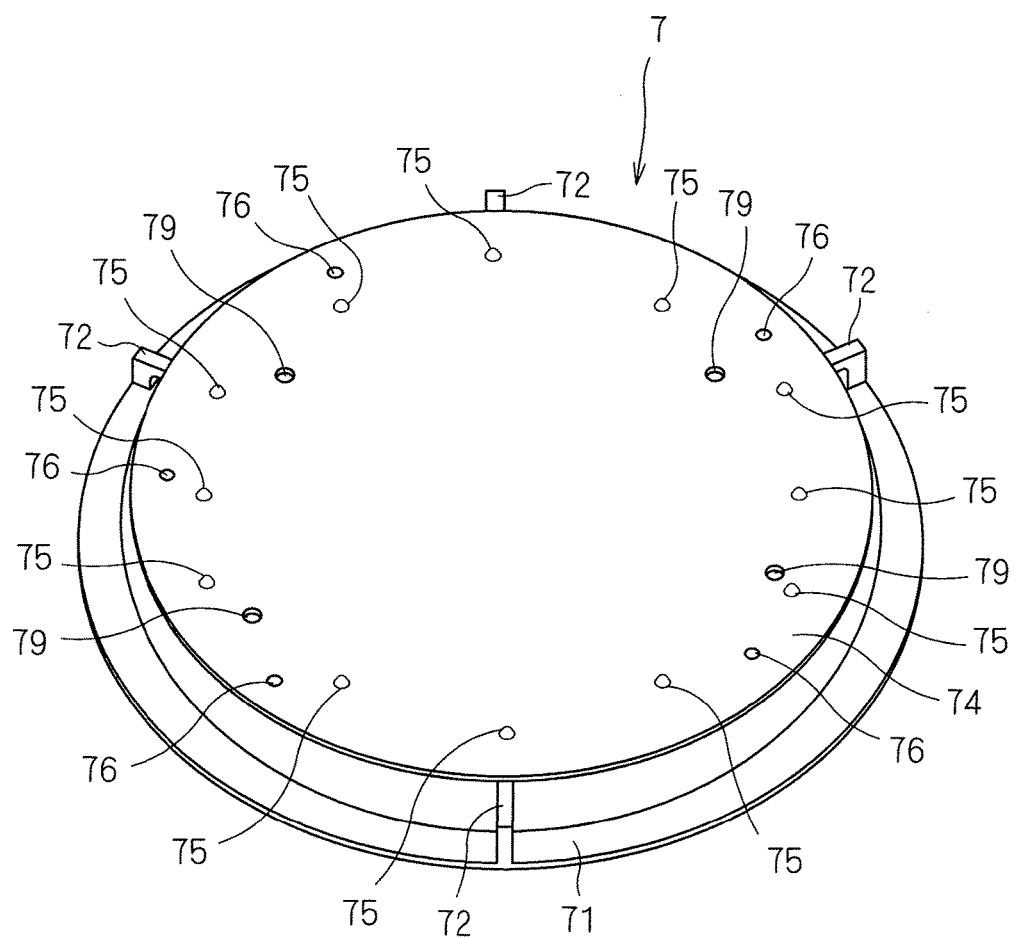

F I G . 3
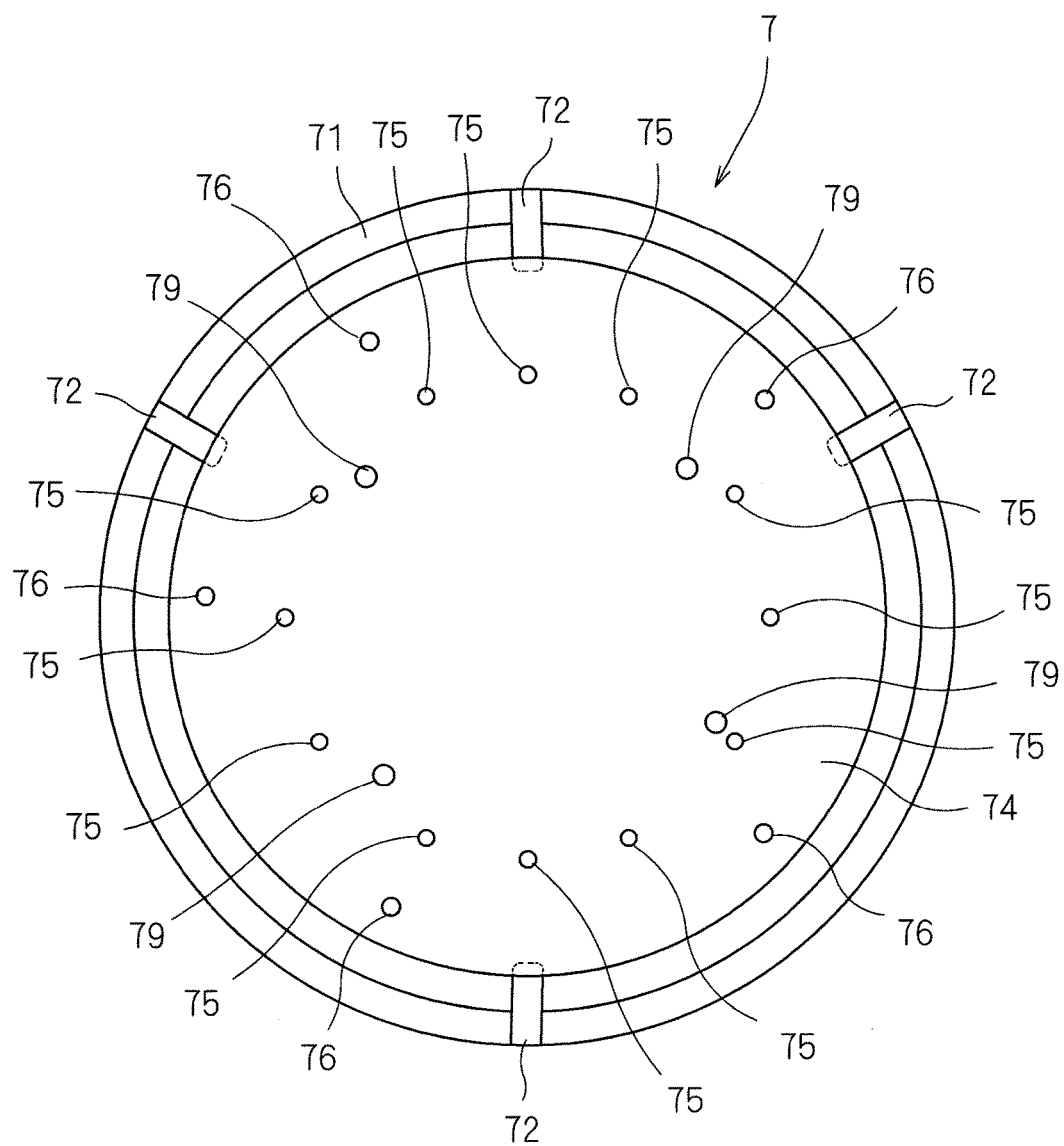

F I G . 4
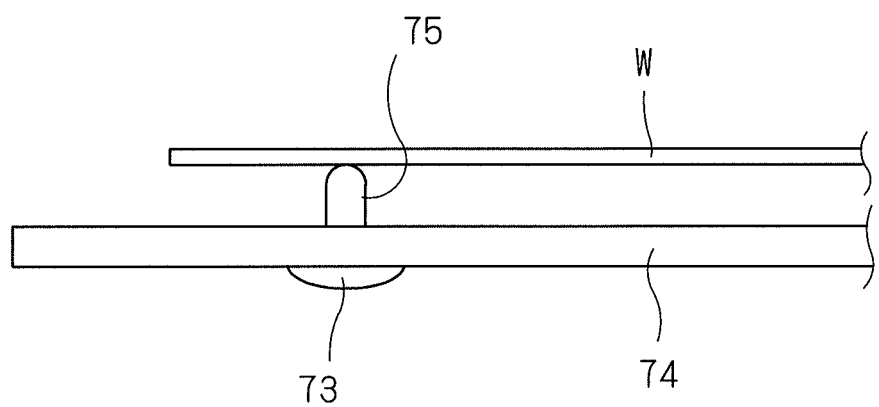

F I G . 8
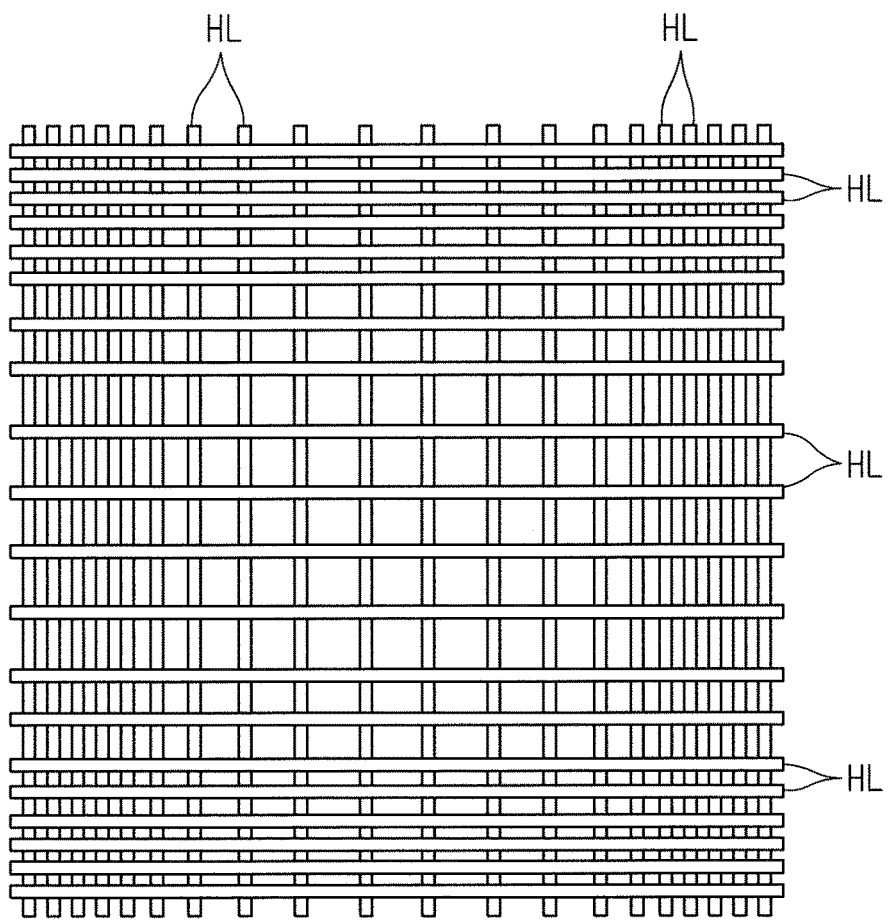

F I G. 9
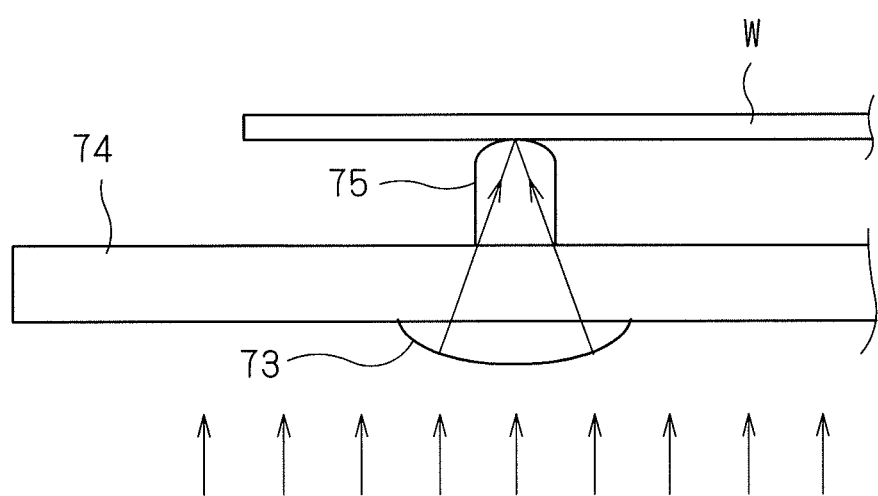

LIGHT IRRADIATION TYPE HEAT TREATMENT APPARATUS

BACKGROUND OF THE INVENTION

Field of the Invention

The present invention relates to a heat treatment apparatus that irradiates a thin-plate precision electronic substrate (hereinafter, merely referred to as a "substrate") such as a semiconductor wafer with light to heat the substrate.

Description of Background Art

In the manufacturing process of a semiconductor device, the introduction of impurities is an essential step for forming pn junctions in a semiconductor wafer. Currently, impurities are typically introduced by ion implantation and subsequent annealing. Ion implantation is a technique for physically implanting impurities by ionizing impurity elements such as boron (B), arsenic (As), and phosphorus (P) and causing the impurity elements to collide with a semiconductor wafer at a high acceleration voltage. The implanted impurities are activated by annealing. If, at this time, annealing time is approximately several seconds or more, the implanted impurities are deeply diffused by heat. As a result, a junction depth may become deeper than necessary, possibly interfering with excellent formation of a device.

Thus, flash lamp annealing (FLA) has recently been receiving attention as an annealing technique for heating a semiconductor wafer in an extremely short time. The flash lamp annealing is a heat treatment technique for raising the temperature of only a surface of the semiconductor wafer implanted with impurities in an extremely short time (a few milliseconds or less) by irradiating the surface of the semiconductor wafer with flash light using xenon flash lamps (hereinafter, the term "flash lamps" used means xenon flash lamps).

The xenon flash lamps have a spectral distribution of radiation ranging from ultraviolet regions to near-infrared regions. A wavelength of light emitted from the xenon flash lamps is shorter than that of light emitted from conventional halogen lamps and substantially coincides with a fundamental absorption band of a silicon semiconductor wafer. Thus, the temperature of the semiconductor wafer can be rapidly increased with a small amount of transmitted light when the semiconductor wafer is irradiated with flash light from the xenon flash lamps. It has been determined that the irradiation with flash light in an extremely short time of a few milliseconds or less can selectively raise the temperature of only near the surface of the semiconductor wafer. Accordingly, such a temperature rise in an extremely short time using the xenon flash lamps allows impurities to be only activated without being deeply diffused.

US2009/0175605 discloses a heating treatment apparatus that includes such xenon flash lamps and has a technique for performing flash heating on a semiconductor wafer supported by a plurality of bumps (support pins) that are in point-contact with the semiconductor wafer and formed on a top surface of a quartz susceptor. The apparatus disclosed in US2009/0175605 irradiates a bottom surface of the semiconductor wafer placed on the susceptor with light emitted from halogen lamps to preheat the semiconductor wafer, and subsequently performs flash heating by irradiating a front surface of the wafer with flash light emitted from the flash lamps.

As disclosed in US2009/0175605, in the case where the semiconductor wafer is supported by the plurality of support pins in point-contact therewith, heat is transmitted between the semiconductor wafer and the support pins at the contact portions. In preheating by the irradiation with the light from the halogen lamps, quartz hardly absorbs the light. Thus, the semiconductor wafer is heated to a temperature higher than that of the quartz susceptor, causing heat to be transmitted from the semiconductor wafer to the support pins. As a result, the vicinities of the contact portions in the semiconductor wafer plane in contact with the plurality of support pins are relatively at a temperature lower than that of the other regions.

For this reason, Japanese Patent Application Laid-Open No. 2015-18909 proposes that a laser beam emitted from a laser light source is reflected by a reflection portion to be introduced to a support pin, and the vicinity of the contact portion between the support pin and the semiconductor wafer in which a temperature tends to drop is heated in an auxiliary manner to prevent the relative drop of the temperature at the portion.

However, for the apparatus disclosed in Japanese Patent Application Laid-Open No. 2015-18909, a plurality of (the same number as the support pins) laser light sources need to be disposed in the chamber. The chamber needs to have a capacity at a minimum in terms of suppressing an amount of atmospheric gas consumed, and thus many laser light sources are hardly disposed in the chamber. It is also preferred that a minimum of devices, which may become sources of contamination, needs to be disposed in the chamber housing the semiconductor wafer.

SUMMARY OF THE INVENTION

The present invention is directed to a heat treatment apparatus that irradiates a substrate with light to heat the substrate.

In an aspect of the present invention, the heat treatment apparatus includes: a chamber housing a substrate; a susceptor that is made of quartz, has a plate shape, and supports the substrate with a plurality of support pins located upright on a top surface of the susceptor between the substrate and the susceptor in the chamber; a light irradiation portion irradiating the substrate supported by the susceptor with light that passes through the susceptor; and a condenser lens condensing part of the light emitted from the light irradiation portion to a contact area between each of the support pins and the substrate.

The vicinity of the contact area between the support pin and the substrate in which a temperature tends to drop is relatively intensely heated, which can suppress the drop in temperature. The simple configuration can uniformize an in-plane temperature distribution of the substrate during light irradiation.

The present invention therefore has an object to uniformize the in-plane temperature distribution of the substrate during light irradiation with the simple configuration.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a perspective view showing an overall external view of a retaining portion;

FIG. 3 is a plan view of the retaining portion when viewed from above;

FIG. 4 shows the vicinity of a support pin of a susceptor when viewed from the side;

FIG. 8 is a plan view showing the arrangement of a plurality of halogen lamps;

FIG. 9 shows light condensed by a condenser lens; and

DESCRIPTION OF THE PREFERRED EMBODIMENT

The following describes an embodiment of the present invention with reference to the drawings.

Figure 1:
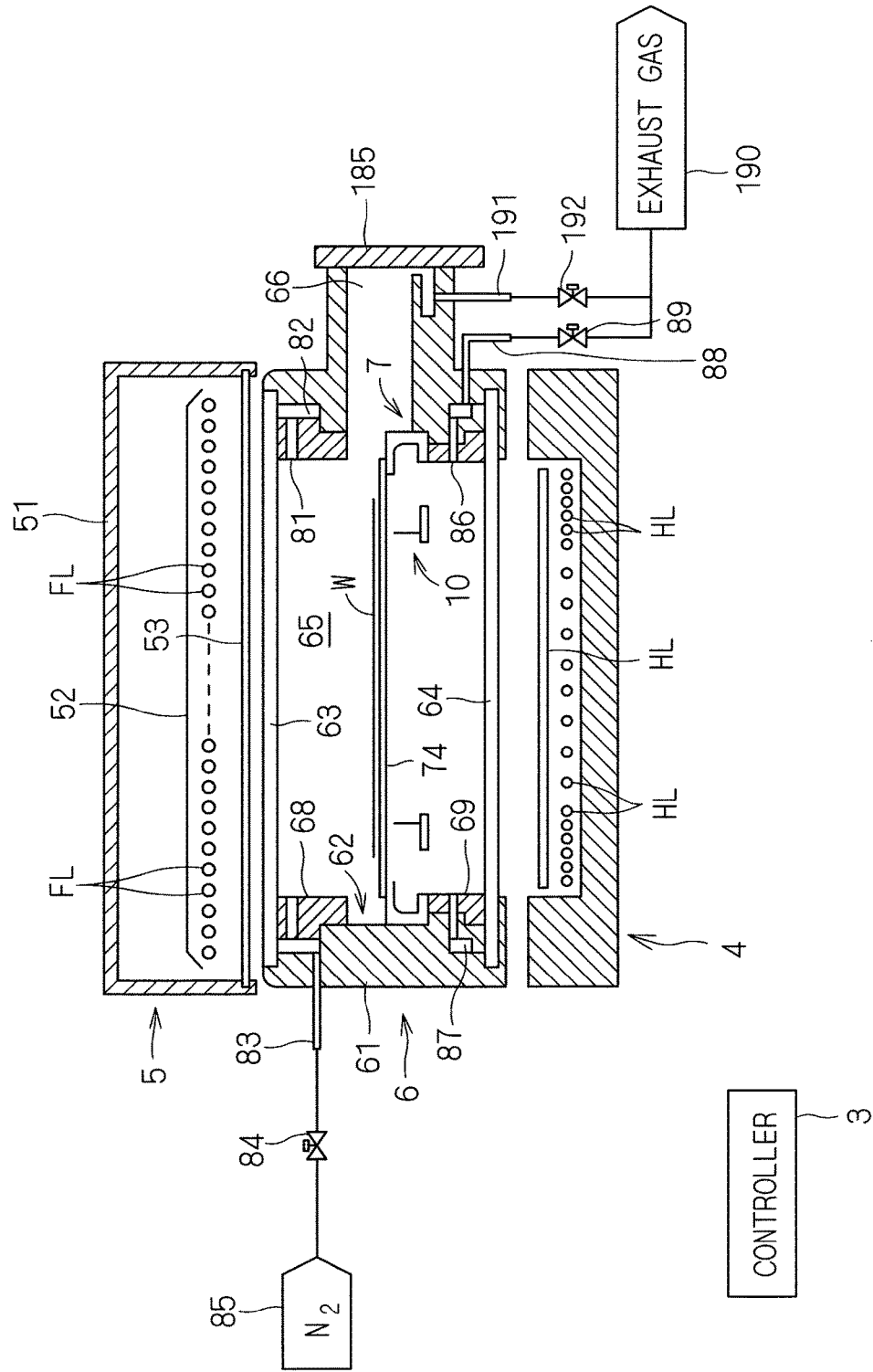
FIG. 1 is a longitudinal cross-sectional view showing a configuration of a heat treatment apparatus according to the present invention.

FIG. 1 is a longitudinal cross-sectional view showing a configuration of a heat treatment apparatus 1 according to the present invention. The heat treatment apparatus 1 in this embodiment is a flash-lamp annealing apparatus that heats a semiconductor wafer W having a disc shape and serving as a substrate by irradiating the semiconductor wafer W with flash light. While the size of the semiconductor wafer W to be treated is not particularly limited, the semiconductor wafer W has a diameter of 300 mm or 450 mm, for example. The semiconductor wafer W before being transported into the heat treatment apparatus 1 is implanted with impurities, and the heat treatment apparatus 1 performs heating treatment to activate the implanted impurities. To facilitate the understanding, the size and number of each part are exaggerated or simplified as necessary in FIG. 1 and subsequent drawings.

The heat treatment apparatus 1 includes a chamber 6 housing the semiconductor wafer W, a flash heating portion 5 including a plurality of built-in flash lamps FL, and a halogen heating portion 4 including a plurality of built-in halogen lamps HL. The flash heating portion 5 is provided above the chamber 6, and the halogen heating portion 4 is provided below the chamber 6. The heat treatment apparatus 1 also includes, in the chamber 6, a retaining portion 7 retaining the semiconductor wafer W thereon in a horizontal position, and a transfer mechanism 10 transferring the semiconductor wafer W between the retaining portion 7 and the outside of the apparatus. The heat treatment apparatus 1 further includes a controller 3 controlling operating mechanisms each provided in the halogen heating portion 4, the flash heating portion 5, and the chamber 6 to perform heat treatment of the semiconductor wafer W.

The chamber 6 is formed of quartz chamber windows installed on the upper side and the lower side of a chamber side portion 61 having a tubular shape. The chamber side portion 61 has the substantially tubular shape having openings at the top and the bottom. An upper chamber window 63 is installed in the upper opening to close the opening while a lower chamber window 64 is installed in the lower opening to close the opening. The upper chamber window 63, which forms the ceiling portion of the chamber 6, is a disc-shaped member made of quartz and functions as a quartz window through which flash light emitted from the flash heating portion 5 is transmitted into the chamber 6. The lower chamber window 64, which forms the floor portion of the chamber 6, is also a disc-shaped member made of quartz and functions as a quartz window through which light emitted from the halogen heating portion 4 is transmitted into the chamber 6.

A reflective ring 68 is mounted on an upper portion of an inner wall surface of the chamber side portion 61, and a reflective ring 69 is mounted on a lower portion thereof. Both of the reflective rings 68, 69 have an annular shape. The upper reflective ring 68 is mounted by being fit on the chamber side portion 61 from thereabove. On the other hand, the lower reflective ring 69 is mounted by being fit on the chamber side portion 61 from therebelow and fastened with screws, which are not shown. In other words, the reflective rings 68, 69 are both removably mounted on the chamber side portion 61. The inner space of the chamber 6, namely, the space surrounded by the upper chamber window 63, the lower chamber window 64, the chamber side portion 61, and the reflective rings 68, 69 is defined as a heat treatment space 65.

The reflective rings 68, 69 are mounted on the chamber side portion 61, to thereby form a recessed portion 62 in the inner wall surface of the chamber 6. In other words, the recessed portion 62 is surrounded by the central portion of the inner wall surface of the chamber side portion 61 on which the reflective rings 68, 69 are not mounted, a lower end face of the reflective ring 68, and an upper end face of the reflective ring 69. The recessed portion 62 has an annular shape in a horizontal direction in the inner wall surface of the chamber 6 so as to surround the retaining portion 7 retaining the semiconductor wafer W.

The chamber side portion 61 and the reflective rings 68, 69 are formed of a metal material (for example, stainless steel) having excellent strength and excellent heat resistance. The reflective rings 68, 69 have inner circumferential surfaces mirror-finished by electrolytic nickel plating.

The chamber side portion 61 has a transport opening (throat) 66 formed therein for allowing the semiconductor wafer W to be transported into and out of the chamber 6. The transport opening 66 is configured to be openable and closable by means of a gate valve 185. The transport opening 66 is communicatively connected to an outer circumferential surface of the recessed portion 62. Accordingly, when the transport opening 66 is opened by the gate valve 185, the semiconductor wafer W can be transported into and out of the heat treatment space 65 through the recessed portion 62 from the transport opening 66. When the transport opening 66 is closed by the gate valve 185, the heat treatment space 65 in the chamber 6 is an enclosed space.

A gas supply port 81 supplying treatment gas (nitrogen gas ($N_2$) in this embodiment) into the heat treatment space 65 is formed in an upper portion of the inner wall of the chamber 6. The gas supply port 81 is formed in a position above the recessed portion 62 and may be provided in the reflective ring 68. The gas supply port 81 is communicatively connected to a gas supply pipe 83 through a buffer space 82 formed in an annular shape inside the side wall of the chamber 6. The gas supply pipe 83 is connected to a gas supply source 85. A valve 84 is located in a path of the gas supply pipe 83. When the valve 84 is opened, nitrogen gas is fed from the gas supply source 85 into the buffer space 82. The nitrogen gas flowing into the buffer space 82 spreads out in the buffer space 82, which has fluid resistance lower than that of the gas supply port 81, and is then supplied into the heat treatment space 65 through the gas supply port 81. The treatment gas is not limited to the nitrogen gas, and may be an inert gas such as argon (Ar) and helium (He) or a reactive gas such as oxygen ($O_2$), hydrogen ($H_2$), chlorine ($Cl_2$), hydrogen chloride (HCl), ozone ($O_3$), and ammonia ($NH_3$).

A gas exhaust port 86 discharging the gas from the heat treatment space 65 is formed in a lower portion of the inner wall of the chamber 6. The gas exhaust port 86 is formed in a position below the recessed portion 62 and may be provided in the reflective ring 69. The gas exhaust port 86 is communicatively connected to a gas exhaust pipe 88 through a buffer space 87 formed in an annular shape inside the side wall of the chamber 6. The gas exhaust pipe 88 is connected to an exhaust portion 190. A valve 89 is located in a path of the gas exhaust pipe 88. When the valve 89 is opened, the gas in the heat treatment space 65 is discharged from the gas exhaust port 86 into the gas exhaust pipe 88 through the buffer space 87. A configuration is also possible in which a plurality of gas supply ports 81 and a plurality of gas exhaust ports 86 are provided in the circumferential direction of the chamber 6, or a configuration is possible in which the gas supply port 81 and the gas exhaust port 86 are slit-shaped. Moreover, the gas supply source 85 and the exhaust portion 190 may be mechanisms provided in the heat treatment apparatus 1, or may be utilities in a factory in which the heat treatment apparatus 1 is installed.

A gas exhaust pipe 191 discharging the gas in the heat treatment space 65 is connected to an end of the transport opening 66. The gas exhaust pipe 191 is connected to the exhaust portion 190 through a valve 192. By opening the valve 192, the gas in the chamber 6 is discharged through the transport opening 66.

FIG. 2 is a perspective view showing an overall external view of the retaining portion 7. FIG. 3 is a plan view of the retaining portion 7 when viewed from above. The retaining portion 7 includes a base ring 71, connecting portions 72, and a susceptor 74. The base ring 71, the connecting portions 72, and the susceptor 74 are each made of quartz. In other words; the entire retaining portion 7 is made of quartz.

The base ring 71 is a quartz member having an annular shape. The base ring 71 is placed on a bottom surface of the recessed portion 62 and thereby supported on the wall surface of the chamber 6 (see FIG. 1). On a top surface of the base ring 71 having the annular shape, the plurality of (in this embodiment, four) connecting portions 72 are provided upright in a circumferential direction of the base ring 71. The connecting portions 72 are also the quartz members and are fixedly attached to the base ring 71 by welding. The base ring 71 may have an arc shape that is an annular shape with a missing part.

The susceptor 74 having a plate shape is supported by the four connecting portions 72 provided on the base ring 71. The susceptor 74 is a circular retaining plate made of quartz on which the semiconductor wafer W to be treated is placed and retained. The susceptor 74 has a diameter greater than that of the semiconductor wafer W. In other words, the susceptor 74 has a planar size greater than that of the semiconductor wafer W. The susceptor 74 may have a thickness set as appropriate, for example, a thickness of 2.5 mm.

A plurality of support pins (bump pins) 75 are provided upright on a top surface of the susceptor 74. In this embodiment, a total of 12 support pins 75 are provided upright at every 30° along a circumference of a circle concentric with the outer circumferential circle of the circular susceptor 74. The diameter of the circle along which the 12 support pins 75 are disposed (distance between the support pins 75 opposite from each other) is smaller than the diameter of the semiconductor wafer W. Each of the support pins 75 is made of quartz. The plurality of support pins 75 may be provided upright while fitting in recessed portions formed in the top surface of the susceptor 74, for example.

A plurality of (in this embodiment, five) guide pins 76 are provided upright on the top surface of the susceptor 74. The five guide pins 76 are also provided along the circumference of the circle concentric with the outer circumferential circle of the susceptor 74. Note that the diameter of the circle along which the five guide pins 76 are disposed is slightly greater than the diameter of the semiconductor wafer W. Each of the guide pins 76 is also made of quartz. Further, the susceptor 74 has four through holes 79 formed therein, the through holes 79 allowing lift pins 12 of the transfer mechanism 10, which will be described below, to penetrate for transferring the semiconductor wafer W.

The four connecting portions 72 provided upright on the base ring 71 are fixedly attached to a peripheral portion of a bottom surface of the susceptor 74 by welding. In other words, the connecting portions 72 fixedly connect the susceptor 74 to the base ring 71. The base ring 71 of the retaining portion 7 is supported on the wall surface of the chamber 6, and thus the retaining portion 7 is mounted on the chamber 6. While the retaining portion 7 is mounted on the chamber 6, the susceptor 74 is in a horizontal position (a position at which the normal coincides with the vertical direction).

The semiconductor wafer W transported into the chamber 6 is placed and supported in the horizontal position on the susceptor 74 of the retaining portion 7 mounted on the chamber 6. The semiconductor wafer W is supported by the 12 support pins 75 that are in point-contact with the semiconductor wafer W and provided upright on the top surface of the susceptor 74, and the semiconductor wafer W is retained by the susceptor 74. In other words, the semiconductor wafer W is supported by the 12 support pins 75 at a predetermined interval from the top surface of the susceptor 74. The guide pins 76 have a height greater than a height of the support pins 75. Therefore, the guide pins 76 prevent the position of the semiconductor wafer W supported by the 12 support pins 75 from being shifted in the horizontal direction.

Figure 5:
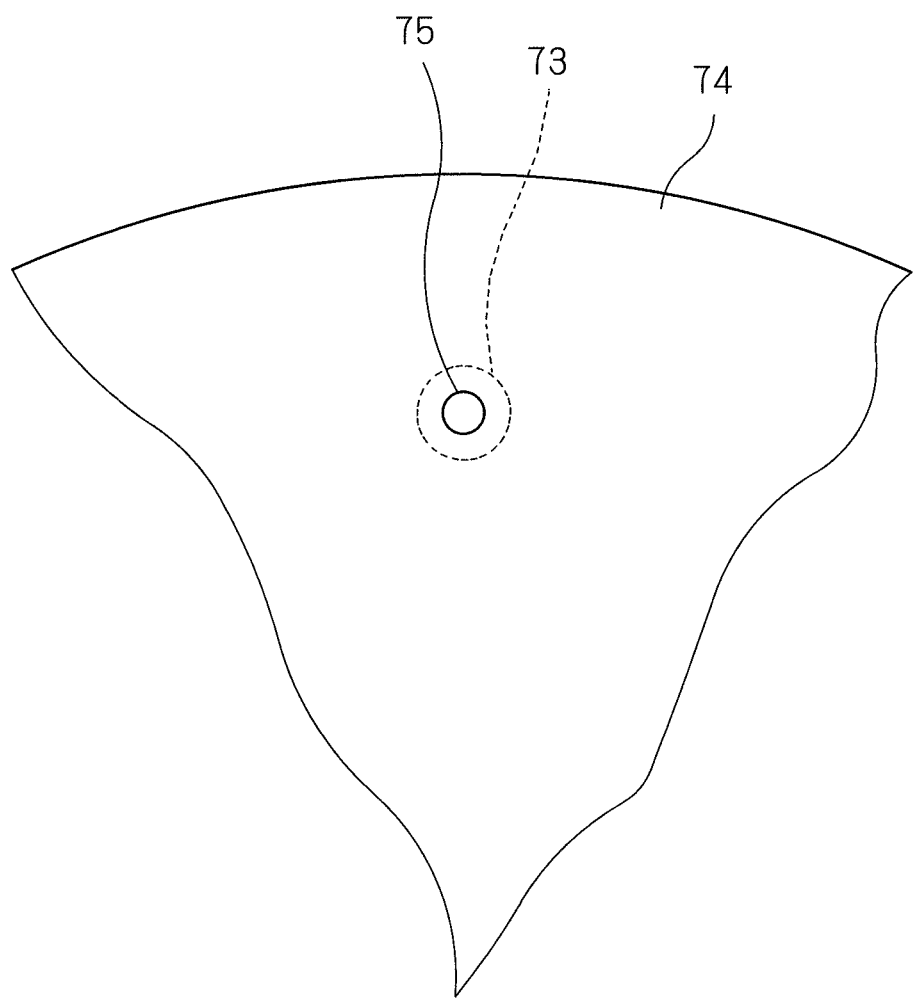
FIG. 5 shows the vicinity of the support pin of the susceptor when viewed from the top.

FIG. 4 shows the vicinity of the support pin 75 of the susceptor 74 when viewed from the side. FIG. 5 shows the vicinity of the support pin 75 of the susceptor 74 when viewed from the top. As shown in FIGS. 4 and 5, a condenser lens 73 is provided on the bottom surface of the susceptor 74. In this embodiment, the condenser lens 73 is a quartz convex lens. The condenser lens 73 is provided on a surface of the susceptor 74 opposite to the position in which each of the support pins 75 is provided upright with respect to the susceptor 74. In other words, the condenser lens 73 is provided correspondingly to each of the plurality of the support pins 75, and a total of 12 condenser lenses 73 are provided at every 30° on the bottom surface of the susceptor 74 in this embodiment. Each of the condenser lenses 73 is provided such that its optical axis coincides with the central axis of the corresponding support pin 75. Each of the condenser lenses 73 is preferably designed so as to have its focus being a contact portion between the corresponding support pin 75 and the semiconductor wafer W.

Figure 6:
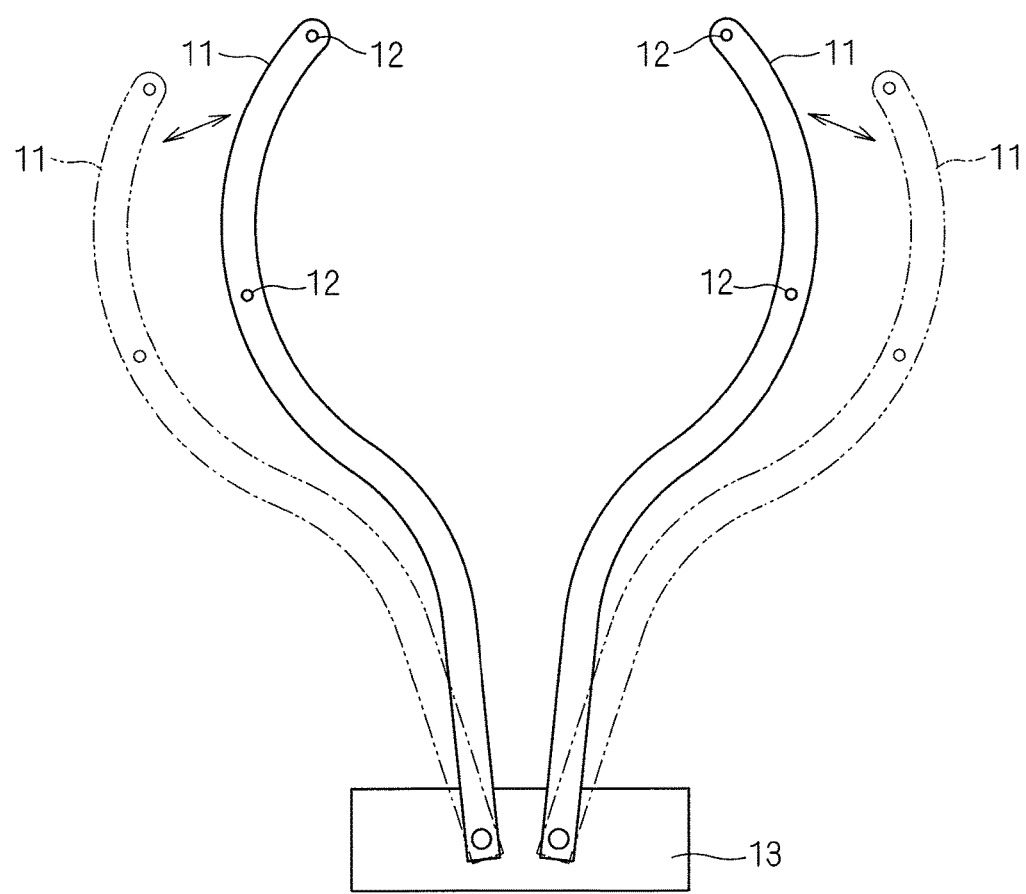
FIG. 6 is a plan view of a transfer mechanism.
Figure 7:
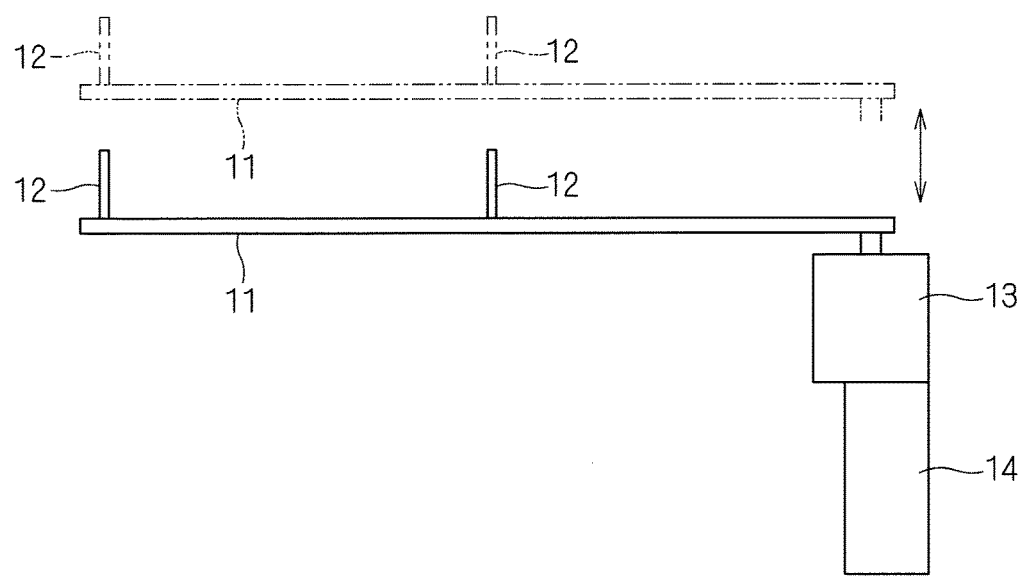
FIG. 7 is a side view of the transfer mechanism.

FIG. 6 is a plan view of the transfer mechanism 10. FIG. 7 is a side view of the transfer mechanism 10. The transfer mechanism 10 includes two transfer arms 11. The transfer arms 11 have an arc shape so as to fit along the recessed portion 62 having the substantially annular shape. The transfer arms 11 each have the two lift pins 12 provided upright thereon. Each of the transfer arms 11 is configured to be pivotable by a horizontal movement mechanism 13. The horizontal movement mechanism 13 horizontally moves the pair of transfer arms 11 between a transfer operation position (the position indicated by the solid line in FIG. 6) at which the transfer of the semiconductor wafer W to the retaining portion 7 is performed and a retracted position (the position indicated by the dashed double-dotted line in FIG. 6) at which the transfer arms 11 do not overlap the semiconductor wafer W retained on the retaining portion 7 in plan view. The horizontal movement mechanism 13 may be a mechanism for separately pivoting the transfer arms 11 by separate motors, or a mechanism for pivoting the pair of transfer arms 11 in conjunction with each other by a single motor using a link mechanism.

The pair of transfer arms 11 are elevated and lowered together with the horizontal movement mechanism 13 by an elevating mechanism 14. When the elevating mechanism 14 elevates the pair of transfer arms 11 at the transfer operation position, a total of four lift pins 12 pass through the through holes 79 (see FIGS. 2 and 3) formed in the susceptor 74 such that the upper ends of the lift pins 12 protrude from the top surface of the susceptor 74. On the other hand, when the elevating mechanism 14 lowers the pair of transfer arms 11 at the transfer operation position so as to pull the lift pins 12 out of the through holes 79 and the horizontal movement mechanism 13 moves the pair of transfer arms 11 to open the pair of transfer arms 11, each of the transfer arms 11 moves to the retracted position. The retracted position of the pair of transfer arms 11 is located directly above the base ring 71 of the retaining portion 7. The base ring 71 is placed on the bottom surface of the recessed portion 62, so that the retracted position of the transfer arms 11 is located inside the recessed portion 62. An exhaust mechanism, which is not shown, is also provided near the area where driving portions (the horizontal movement mechanism 13 and the elevating mechanism 14) of the transfer mechanism 10 are provided, and the exhaust mechanism discharges the atmosphere around the driving portions of the transfer mechanism 10 to the outside of the chamber 6.

Referring back to FIG. 1, the flash heating portion 5 provided above the chamber 6 includes, inside a housing 51, a light source formed of a plurality of (in this embodiment, 30) xenon flash lamps FL and a reflector 52 provided so as to cover the top of the light source. Moreover, a lamp-light radiation window 53 is attached as the bottom portion of the housing 51 of the flash heating portion 5. The lamp-light radiation window 53 forming the floor portion of the flash heating portion 5 is a plate-like quartz window made of quartz. The flash heating portion 5 is disposed above the chamber 6, so that the lamp-light radiation window 53 and the upper chamber window 63 face each other. The flash lamps FL emit flash light to the heat treatment space 65 from above the chamber 6 through the lamp-light radiation window 53 and the upper chamber window 63.

The plurality of flash lamps FL are rod-shaped lamps each having an elongated cylindrical shape and are arranged in a planar array such that the longitudinal directions of the flash lamps FL are parallel to each other along a main surface of the semiconductor wafer W retained by the retaining portion 7 (namely, in the horizontal direction). Thus, the plane formed by the array of the flash lamps FL is also a horizontal plane.

The xenon flash lamps FL each include a rod-shaped glass tube (discharge tube) and a trigger electrode provided on the outer circumferential surface of the glass tube, the glass tube containing xenon gas sealed therein and including an anode and a cathode that are disposed at opposite ends of the glass tube and are connected to a capacitor. The xenon gas is an electrical insulating material, and thus no electricity passes through the glass tube in a normal state even if electric charge is stored in the capacitor. However, in a case where a high voltage is applied to the trigger electrode to cause an electrical breakdown, the electricity stored in the capacitor instantaneously flows through the glass tube, and xenon atoms or xenon molecules are excited at this time to cause light emission. The xenon flash lamps FL have the properties of being capable of emitting extremely intense light as compared with a continuously lit light source such as the halogen lamps HL because the electrostatic energy previously stored in the capacitor is converted into an extremely short optical pulse of 0.1 millisecond to 100 milliseconds. In other words, the flash lamps FL are pulse light-emitting lamps that instantaneously emit light in an extremely short time of less than a second. In addition, light emission time of the flash lamps FL can be adjusted by a coil constant of a lamp power supply that supplies power to the flash lamps FL.

The reflector 52 is provided above the plurality of flash lamps FL so as to cover all of the flash lamps FL. A basic function of the reflector 52 is to reflect the flash light emitted from the plurality of flash lamps FL toward the heat treatment space 65. The reflector 52 is formed of a plate made of an aluminum alloy, and the surface (surface facing the flash lamps FL) of the reflector 52 is roughened by blasting.

The halogen heating portion 4 provided below the chamber 6 includes a plurality of (in this embodiment, 40) halogen lamps HL inside. The halogen heating portion 4 is a light irradiation portion in which the plurality of halogen lamps HL emit light to the heat treatment space 65 from below the chamber 6 through the lower chamber window 64 to heat the semiconductor wafer W. The halogen heating portion 4 emits halogen light to the bottom surface of the semiconductor wafer W supported by the susceptor 74 through the quartz susceptor 74.

FIG. 8 is a plan view showing the arrangement of the plurality of halogen lamps HL. In this embodiment, 20 halogen lamps HL are disposed in each of an upper row and a lower row. Each of the halogen lamps HL is a rod-shaped lamp having an elongated cylindrical shape. The 20 halogen lamps HL in each of the upper row and the lower row are arranged such that their longitudinal directions are parallel to each other along the main surface of the semiconductor wafer W retained by the retaining portion 7 (namely, in the horizontal direction). Thus, the plane formed by the array of the halogen lamps HL in the upper row and the plane formed by the array of the halogen lamps HL in the lower row are both horizontal planes.

As shown in FIG. 8, in each of the upper row and the lower row, the halogen lamps HL are disposed at a higher density in a region opposed to the peripheral portion of the semiconductor wafer W retained by the retaining portion 7 than in a region opposed to the central portion thereof. In other words, in each of the upper row and the lower row, the halogen lamps HL are disposed at a shorter pitch in the peripheral portion of the array of the halogen lamps than in the central portion thereof. This allows a greater amount of light to be applied to the peripheral portion of the semiconductor wafer W in which the temperature tends to drop during heating by the irradiation with light from the halogen heating portion 4.

A lamp group of the halogen lamps HL in the upper row and a lamp group of the halogen lamps HL in the lower row are arranged so as to intersect each other in the grid pattern. In other words, a total of 40 halogen lamps HL are disposed such that the longitudinal direction of each of the halogen lamps HL in the upper row and the longitudinal direction of each of the halogen lamps HL in the lower row are orthogonal to each other.

The halogen lamps HL are each a filament light source that passes current through a filament disposed in the glass tube to make the filament incandescent and cause light emission. The glass tube contains a gas sealed therein, the gas being prepared by introducing a halogen element (such as iodine and bromine) in trace amounts into an inert gas such as nitrogen and argon. The introduction of the halogen element allows the temperature of the filament to be set at a high temperature while suppressing breakage of the filament. Therefore, the halogen lamps HL have the properties of having a longer life than typical incandescent lamps and being capable of continuously emitting intense light. In other words, the halogen lamps HL are each a continuously lit lamp that continuously emits light for at least a second or longer. The halogen lamps HL that are the rod-shaped lamps have a long life, and disposing the halogen lamps HL in the horizontal direction enhances the efficiency of radiation to the semiconductor wafer W located above the halogen lamps HL.

The controller 3 controls the above-described various operating mechanisms provided in the heat treatment apparatus 1. The controller 3 has a similar hardware configuration to that of a commonly used computer. More specifically, the controller 3 includes a CPU being a circuit for executing various types of computation processing, a ROM being a read-only memory for storing a basic program, a RAM being a readable and writable memory for storing various pieces of information, and a magnetic disk for storing control software and data. The CPU of the controller 3 executes a predetermined processing program, and thus the processing in the heat treatment apparatus 1 proceeds.

The heat treatment apparatus 1 includes, in addition to the above-described components, various cooling structures to prevent an excessive temperature increase in the halogen heating portion 4, the flash heating portion 5, and the chamber 6 due to thermal energy generated from the halogen lamps HL and the flash lamps FL during the heat treatment of the semiconductor wafer W. For example, the chamber 6 includes a water-cooled tube (not shown) in the wall. The halogen heating portion 4 and the flash heating portion 5 have an air-cooling structure that forms a flow of gas therein to discharge heat. Air is also supplied to a gap between the upper chamber window 63 and the lamp-light radiation window 53 to cool the flash heating portion 5 and the upper chamber window 63. The heat treatment apparatus 1 further includes a temperature sensor (a radiation thermometer and/or a contact thermometer) for measuring temperature of the semiconductor wafer W retained by the susceptor 74.

Next, a procedure for the treatment of the semiconductor wafer W in the heat treatment apparatus 1 is described. The semiconductor wafer W to be treated here is a semiconductor substrate in which impurities (ions) are doped by ion implantation. The heat treatment apparatus 1 performs flash light irradiation heating treatment (annealing) to activate the impurities. The procedure for the treatment of the heat treatment apparatus 1 described below proceeds as the controller 3 controls each of the operating mechanisms in the heat treatment apparatus 1.

First, the valve 84 for supplying gas is opened and the valves 89, 192 for discharging gas are opened, thereby starting gas supply and exhaust into and from the chamber 6. When the valve 84 is opened, nitrogen gas is supplied from the gas supply port 81 into the heat treatment space 65. When the valve 89 is opened, the gas in the chamber 6 is discharged from the gas exhaust port 86. Accordingly, the nitrogen gas supplied from above the heat treatment space 65 in the chamber 6 flows downward and is discharged from below the heat treatment space 65.

When the valve 192 is opened, the gas in the chamber 6 is also discharged from the transport opening 66. Further, the atmosphere around the driving portions of the transfer mechanism 10 is also discharged from an exhaust mechanism, which is not shown. In addition, the nitrogen gas is continuously supplied to the heat treatment space 65 during the heat treatment of the semiconductor wafer W in the heat treatment apparatus 1, and an amount of supply is appropriately changed according to treatment processes.

Subsequently, the gate valve 185 is opened to open the transport opening 66, and the semiconductor wafer W after the ion implantation is transported into the heat treatment space 65 through the transport opening 66 by a transport robot outside the apparatus. The semiconductor wafer W transported by the transport robot is stopped after being moved to a position directly above the retaining portion 7. Then, the pair of transfer arms 11 of the transfer mechanism 10 are moved horizontally from the retracted position to the transfer operation position and are elevated, and thus the lift pins 12 protrude from the top surface of the susceptor 74 through the through holes 79 so as to receive the semiconductor wafer W. At this time, the lift pins 12 are elevated to positions above the top ends of the support pins 75 of the susceptor 74.

After the semiconductor wafer W is placed on the lift pins 12, the transfer robot is withdrawn from the heat treatment space 65, and the gate valve 185 closes the transport opening 66. Then, the pair of the transfer arms 11 are lowered, so that the semiconductor wafer W is transferred from the transfer mechanism 10 to the susceptor 74 of the retaining portion 7 and is retained in the horizontal position from below by the susceptor 74.

The semiconductor wafer W is supported by the 12 support pins 75 that are in point-contact with the semiconductor wafer W and provided upright on the top surface of the susceptor 74, and the semiconductor wafer W is retained by the susceptor 74. The semiconductor wafer W is supported by the 12 support pins 75 in point-contact therewith such that the center of the semiconductor wafer W coincides with the central axis of the susceptor 74 (namely, the center of the top surface of the susceptor 74). The semiconductor wafer W supported by the support pins 75 are surrounded by the five guide pins 76. The semiconductor wafer W is retained by the susceptor 74 while the front surface that has the pattern formed thereon and is implanted with the impurities faces upward. The predetermined interval is formed between the back surface (opposite to the front surface) of the semiconductor wafer W supported by the plurality of support pins 75 and the top surface of the susceptor 74. The semiconductor wafer W is supported parallel to the top surface of the susceptor 74. The pair of transfer arms 11 lowered below the susceptor 74 are retracted to the retracted position, namely, the inside of the recessed portion 62, by the horizontal movement mechanism 13.

After the semiconductor wafer W is retained in the horizontal position from below by the susceptor 74 of the retaining portion 7, the 40 halogen lamps HL of the halogen heating portion 4 turn on all at once to start preheating (assist-heating). The halogen light emitted from the halogen lamps HL transmits through the lower chamber window 64 and the susceptor 74 made of quartz and is applied to the back surface of the semiconductor wafer W. By receiving the light emitted from the halogen lamps HL, the semiconductor wafer W is preheated and raised in temperature. In addition, the transfer arms 11 of the transfer mechanism 10 are retracted inside the recessed portion 62, so that the transfer arms 11 do not obstruct the heating with the halogen lamps HL.

For the preheating with the halogen lamps HL, a temperature sensor, which is not shown, measures the temperature of the semiconductor wafer W. The measured temperature of the semiconductor wafer W is transmitted from the temperature sensor to the controller 3. The controller 3 monitors whether the temperature of the semiconductor wafer W raised in temperature by the irradiation with the light from the halogen lamps HL has reached a predetermined preheating temperature T1. The preheating temperature T1 is set to approximately 200 to 800° C., at which there is no possibility that the impurities doped in the semiconductor wafer W are diffused by heat, and preferably, approximately 350 to 600° C. (in this embodiment, 600° C.).

After the temperature of the semiconductor wafer W has reached the preheating temperature T1, the controller 3 temporarily maintains the semiconductor wafer W at the preheating temperature T1. Specifically, at the point in time when the temperature of the semiconductor wafer W measured by the temperature sensor has reached the preheating temperature T1, the controller 3 controls the output of the halogen lamps HL to maintain the temperature of the semiconductor wafer W at almost the preheating temperature T1 for a predetermined time.

As described above, the halogen lamps HL perform preheating while the semiconductor wafer W is supported by the 12 support pins 75 in point-contact therewith. The quartz susceptor 74 including the support pins 75 does not absorb most of the light emitted from the halogen lamps HL and allows the light to pass therethrough. Thus, at the time of preheating, the semiconductor wafer W absorbs the light from the halogen lamps HL to rise in temperature while the temperature of the susceptor 74 including the support pins 75 is not significantly increased and is relatively lower than the temperature of the semiconductor wafer W. Consequently, heat is transmitted from the semiconductor wafer W to the support pins 75 directly contacting the semiconductor wafer W, and thus the vicinities the contact portions of the wafer in contact with the 12 support pins 75 have a temperature decreased relatively lower than the other regions of the wafer. As a result, an in-plane temperature distribution of the semiconductor wafer W tends to be uneven.

For this reason, the condenser lens 73 is provided on the bottom surface of the susceptor 74 correspondingly to each of the 12 support pins 75 in this embodiment. FIG. 9 shows light condensed by the condenser lens 73. The condenser lens 73 is provided on the surface (bottom surface) of the susceptor 74 opposite to the position in which each of the support pins 75 is provided upright with respect to the susceptor 74. Each of the condenser lenses 73 is provided such that its optical axis coincides with the central axis of the corresponding support pin 75. Of the light emitted from the halogen lamps HL, the light entering the condenser lens 73 is thus condensed at the contact portion between the corresponding support pin 75 and the semiconductor wafer W. This relatively increases the intensity of illumination of the vicinity of the contact portion of the semiconductor wafer W in contact with the support pin 75, so that the vicinity of the contact portion rises in temperature. As a result, the vicinity of the contact portion of the semiconductor wafer W in contact with the support pin 75 in which the temperature tends to drop during preheating is relatively intensely heated, which can suppress the drop in temperature. This can minimize the difference in temperature between the vicinity of the contact portion and surrounding regions.

The condenser lens 73 condenses light in such a manner for each of the 12 support pins 75. This individually heats the vicinities of the contact portions between the 12 support pins 75 and the semiconductor wafer W to an increased temperature, thereby suppressing the temperature drop of the vicinities of the contact portions. Thus, the in-plane temperature distribution of the semiconductor wafer W during preheating can be made uniform.

At the point in time when a predetermined time has passed since the temperature of the semiconductor wafer W had reached the preheating temperature T1 by the light emitted from the halogen lamps HL, the flash lamps FL of the flash heating portion 5 emit the flash light to the front surface of the semiconductor wafer W. At this time, part of the flash light emitted from the flash lamps FL travels directly into the chamber 6 while another part of the flash light is reflected by the reflector 52 and then travels into the chamber 6. Flash heating of the semiconductor wafer W is performed by the irradiation with the flash light.

The flash heating is performed by the flash light emitted from the flash lamps FL, so that a temperature of the front surface of the semiconductor wafer W can be increased in a short time. More specifically, the flash light emitted from the flash lamps FL is extremely short intense flash light that results from the conversion of the electrostatic energy previously stored in the capacitor into an extremely short optical pulse and whose irradiation time is approximately longer than or equal to 0.1 millisecond and shorter than or equal to 100 milliseconds. The temperature of the front surface of the semiconductor wafer W subjected to the flash heating by the flash light emitted from the flash lamps FL instantaneously rises to a processing temperature T2 higher than or equal to 1000° C., and then the temperature of the front surface rapidly drops after the impurities implanted into the semiconductor wafer W are activated. In this manner, the heat treatment apparatus 1 can increase and decrease the temperature of the front surface of the semiconductor wafer W in an extremely short time. Thus, the heat treatment apparatus 1 can activate the impurities implanted into the semiconductor wafer W while suppressing the diffusion of the impurities due to heat. In addition, the activation of the impurities needs an extremely shorter time than time needed for the diffusion of the impurities, so that the activation is completed in a short time of approximately 0.1 millisecond to 100 milliseconds while the diffusion does not occur.

In this embodiment, the condenser lens 73 condenses part of the light emitted from the halogen lamps HL to the contact portion between the support pin 75 and the semiconductor wafer W in order to suppress the temperature drop of the vicinity of the contact portion, and the in-plane temperature distribution of the surface of the semiconductor wafer W in the stage of preheating is thus made uniform. As a result, the in-plane temperature distribution of the front surface of the semiconductor wafer W during flash light irradiation can also be made uniform.

The halogen lamps HL turn off after a predetermine time has passed since the completion of the flash heating treatment. As a result, the temperature of the semiconductor wafer W rapidly decreases from the preheating temperature T1. The temperature of the semiconductor wafer W during the drop in temperature is also measured by the temperature sensor, and the measurement result is transmitted to the controller 3. The controller 3 monitors whether the temperature of the semiconductor wafer W has decreased to a predetermined temperature from the measurement result. After the temperature of the semiconductor wafer W has decreased lower than or equal to the predetermined temperature, the pair of transfer arms 11 of the transfer mechanism 10 are moved horizontally from the retracted position to the transfer operation position again and are elevated. Thus, the lift pins 12 protrude from the top surface of the susceptor 74 so as to receive the heat-treated semiconductor wafer W from the susceptor 74. Subsequently, the transport opening 66, which has been closed by the gate valve 185, is opened, and the semiconductor wafer W placed on the lift pins 12 is transported by the transport robot outside the apparatus. The heat treatment of the semiconductor wafer W in the heat treatment apparatus 1 is completed.

In this embodiment, the condenser lens 73 is provided on the bottom surface of the susceptor 74 correspondingly to each of the 12 support pins 75, and the condenser lens 73 condenses part of the light emitted from the halogen lamps HL to the contact portion between the support pin 75 and the semiconductor wafer W. This suppresses the temperature drop of the vicinity of the contact portion to uniformize the in-plane temperature distribution of the surface of the semiconductor wafer W during preheating. As a result, the in-plane temperature distribution of the front surface of the semiconductor wafer W during flash heating can also be made uniform.

In this embodiment, the in-plane temperature distribution of the semiconductor wafer W is made uniform only by providing the condenser lens 73 on the bottom surface of the susceptor 74. The condenser lens 73 made of quartz is in no danger of becoming a source of contamination when being provided in the chamber 6. Moreover, for the chamber 6 having a small capacity, the condenser lens 73 can be easily mounted on the bottom surface of the susceptor 74. In other words, as long as the condenser lens 73 condenses part of the light emitted from the halogen lamps HL to the contact portion between the support pin 75 and the semiconductor wafer W, the simple configuration can uniformize the in-plane temperature distribution of the semiconductor wafer W during light irradiation.

Figure 10:
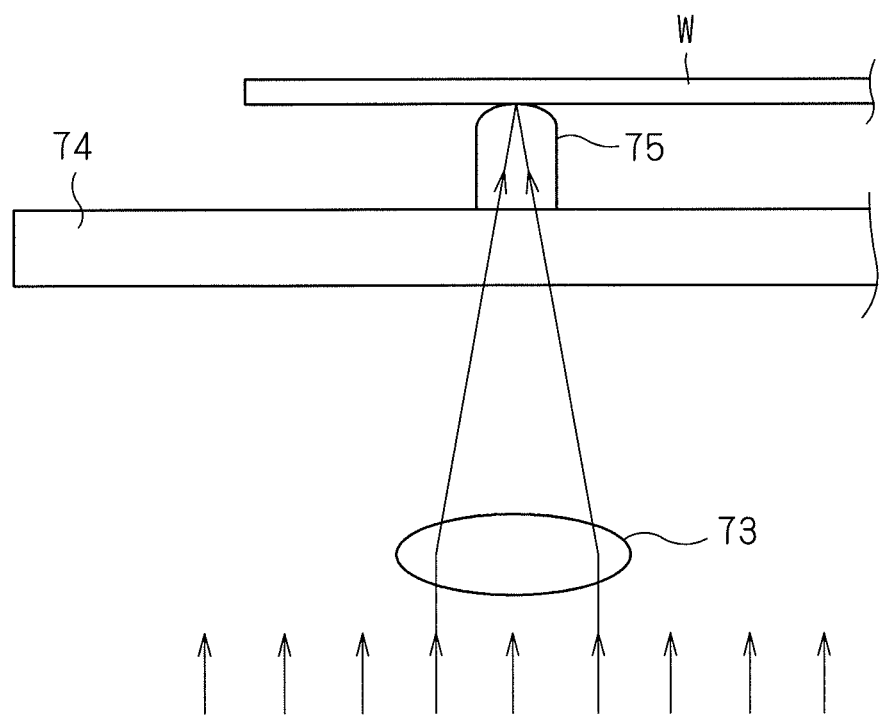
FIG. 10 shows an example of the condenser lens disposed separately from the susceptor.

While the embodiment of the present invention has been described above, various modifications in addition to those described above may be made to the invention without departing from the purpose of the invention. For example, although the condenser lens 73 is provided on the bottom surface of the susceptor 74 in the embodiment described above, the present invention is not limited thereto. The condenser lens 73 may be disposed separately from the susceptor 74 in the chamber 6. FIG. 10 shows an example of the condenser lens 73 disposed separately from the susceptor 74. In the example of FIG. 10, the condenser lens 73 is provided below the susceptor 74 in the chamber 6. Also in this manner, the condenser lens 73 can condense part of the light emitted from the halogen lamps HL to the contact portion between the support pin 75 and the semiconductor wafer W, and thus the same effects as those in the embodiment described above can be obtained.

The condenser lens 73 may be buried in the susceptor 74, or may be provided on the lower chamber window 64 of the chamber 6. The condenser lens 73 is preferably designed such that the condenser lens 73 disposed farther from the susceptor 74 has a longer focal length. In other words, the condenser lens 73 may be disposed in any positions as long as the condenser lens 73 can condense the light emitted from the halogen lamps HL to the contact portion between the support pin 75 and the semiconductor wafer W.

The condenser lens 73 may be a single convex lens or a compound lens including a combination of a plurality of lenses.

The heat treatment technique according to the present invention is also applicable to the case where a ring-shaped support member provided on the top surface of the susceptor 74 supports the semiconductor wafer W. In this case, a ring-shaped convex lens disposed below the susceptor 74 can condense part of the light emitted from the halogen lamps HL to a contact portion between the support member and the semiconductor wafer W. Thus, the same effects as those in the embodiment described above can be obtained.

Although the flash heating portion 5 includes the 30 flash lamps FL in the embodiment described above, the present invention is not limited thereto. The flash heating portion 5 may include a freely-selected number of flash lamps FL. Further, the flash lamps FL are not limited to xenon flash lamps, and may be krypton flash lamps. The number of halogen lamps HL included in the halogen heating portion 4 is not limited to 40 and may be freely selected in such a manner that a plurality of halogen lamps HL are disposed in the upper row and the lower row.

A substrate to be treated by the heat treatment apparatus according to the present invention is not limited to a semiconductor wafer, and may be a glass substrate used in a flat-panel display such as a liquid crystal display, or a substrate for use in solar cell. The technique of the present invention is also applicable to bonding between metal and silicon or crystallization of polysilicon.

The heating treatment technique according to the present invention, which is not limited to flash-lamp annealing apparatuses, is also applicable to lamp annealing apparatuses of single-substrate type including halogen lamps or apparatuses such as CVD apparatuses including heat sources except for flash lamps. Particularly, the technique according to the present invention is preferably applicable to back-side annealing apparatuses in which halogen lamps disposed below a chamber emit light to a back surface of a semiconductor wafer supported by a plurality of support pins on a quartz susceptor to heat-treat the semiconductor wafer.

While the invention has been described in detail, the foregoing description is in all aspects illustrative and not restrictive. It is therefore understood that numerous other modifications and variations can be devised without departing from the scope of the invention.

What is claimed is:

1. A heat treatment apparatus that irradiates a substrate with light to heat the substrate, comprising:
    a chamber for housing a substrate;
    a susceptor that is made of quartz, has a plate shape, and supports the substrate with a plurality of support pins located upright on a top surface of the susceptor between the substrate and the susceptor in the chamber;
    a light irradiation portion irradiating the substrate supported by the susceptor with light that passes through the susceptor; and
    a condenser lens configured to condense part of the light emitted from the light irradiation portion to a contact area between each of the support pins and the substrate, the condenser lens being provided on a bottom surface of the susceptor.

2. The heat treatment apparatus according to claim 1, wherein the condenser lens comprises a convex lens.

3. The heat treatment apparatus according to claim 1, further comprising a flash lamp that irradiates the substrate supported by the susceptor with flash light.

* * * * *